United States Patent [19]

Begin et al.

[11] Patent Number: 4,839,819

[45] Date of Patent: Jun. 13, 1989

[54] INTELLIGENT POWER MONITOR

[75] Inventors: John D. Begin, Warren; James E. Berry, Royal Oak; Paul D. Kretzmer, Oak Park, all of Mich.

[73] Assignee: CTE Valeron Corporation, Troy, Mich.

[21] Appl. No.: 896,416

[22] Filed: Aug. 14, 1986

[51] Int. Cl.⁴ ................... G06F 15/46; G01R 7/00
[52] U.S. Cl. .................... 364/483; 73/862.06; 318/650; 324/142; 361/30; 364/474.17; 364/571.01
[58] Field of Search .............. 364/481, 483, 511, 551, 364/571, 170, 148, 506, 507; 361/30, 81; 324/74, 142, 103 R; 73/112, 862.06; 318/650

[56] References Cited

U.S. PATENT DOCUMENTS

| | | | |
|---|---|---|---|
| 3,688,157 | 8/1972 | Spears | 361/30 |
| 4,096,436 | 6/1978 | Cook et al. | 324/142 |
| 4,150,433 | 4/1979 | Kaniel | 364/571 |
| 4,158,808 | 6/1979 | Massa et al. | 324/74 |
| 4,279,013 | 7/1981 | Cameron et al. | 364/474 |
| 4,290,109 | 9/1981 | Taniguchi et al. | 364/481 |
| 4,345,311 | 8/1982 | Fielden | 324/142 |
| 4,360,879 | 11/1982 | Cameron | 364/483 |
| 4,456,960 | 6/1984 | Wakai | 364/474 |
| 4,509,126 | 4/1985 | Olig et al. | 364/474 |
| 4,545,445 | 10/1985 | Naito | 364/571 |
| 4,622,640 | 11/1986 | Shimamura et al. | 364/483 |
| 4,663,587 | 5/1987 | Mackenzie | 324/142 |
| 4,682,264 | 7/1987 | Demeyer | 364/483 |
| 4,688,194 | 8/1987 | Shimizu | 364/571 |
| 4,698,766 | 10/1987 | Entwhistle et al. | 364/474 |

Primary Examiner—Parshotam S. Lall
Assistant Examiner—Kevin J. Tesha
Attorney, Agent, or Firm—Harness, Dickey & Pierce

[57] ABSTRACT

Apparatus and method for detecting energy, such as power, consumed by a load. The apparatus preferably takes the form of a housing of sufficiently small size to be mounted in a motor control panel of a machine tool. The apparatus includes a digital processor adapted to enable bidirectional communication between the device and an external computer such as a host computer or machine controller. The processor is also used to perform various calibration functions.

22 Claims, 6 Drawing Sheets

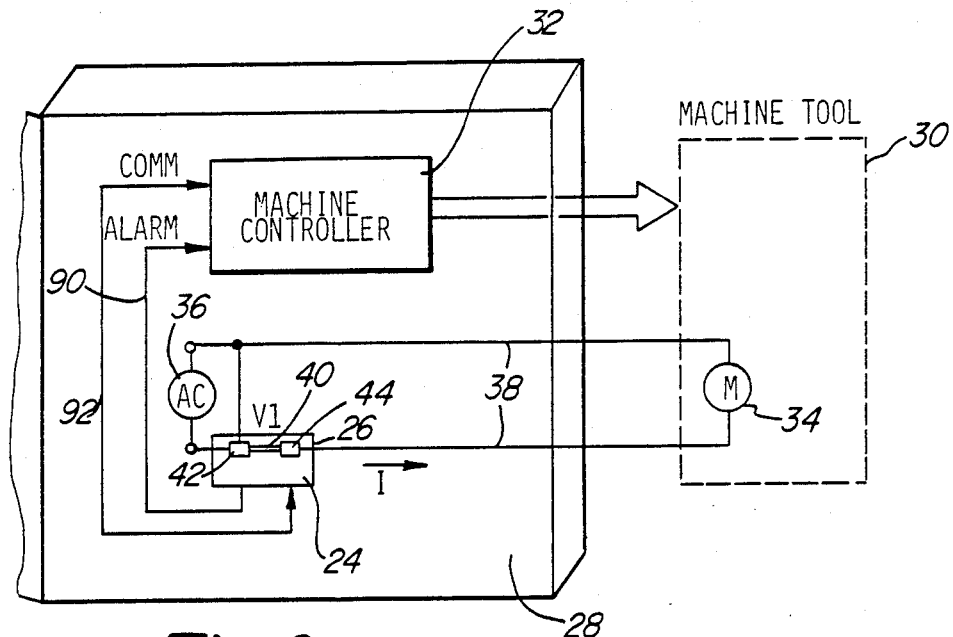
_Fig-2_
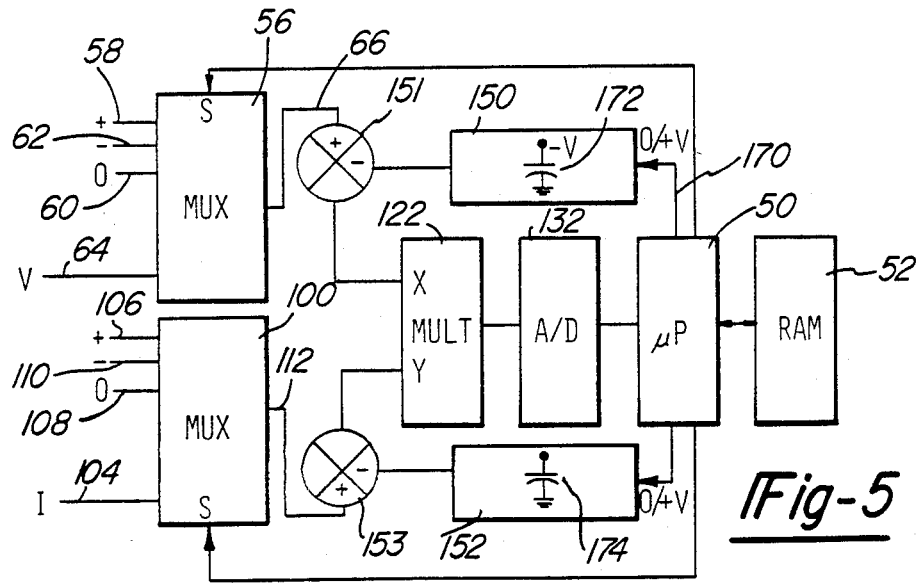
_Fig-5_

INTELLIGENT POWER MONITOR

TECHNICAL FIELD

This invention relates to methods and apparatus for measuring electrical energy and, more particularly, to techniques for monitoring energy-related parameters consumed by a motor in a machine tool.

BACKGROUND

Horsepower and wattmeters have been used in the past to determine the power dissipated in electrical loads like large electrical motors used in machine tools such as lathes, machining centers, grinders, etc. Monitoring the power dissipation in such motors is useful for indicating tool wear, recording operational parameters, maximizing operational efficiencies, preventive maintenance and the like. Historically, wattmeters have been of the galvanometer type which make use of the magnetic interaction between a moving electromagnet on the pointer of the meter and stationary electromagnets. The multiplication of current and voltage necessary to determine power is accomplished by mechanically passing these two coils through one another's electromagnetic fields. Unfortunately, this type of meter has a number of drawbacks. First, perfect coupling cannot be achieved between the electromagnetic fields and, thus, inaccuracies are introduced into the meter. Secondly, this type of meter does not lend itself well to interfacing with electronic equipment, such as process controllers or recorders, due to the heavy current which is necessarily passed through the meter.

A more modern type of wattmeter uses the Hall effect principle in an integrated circuit surrounded by the same type of electromagnets as in the galvanometer wattmeter. This type of wattmeter can be interfaced with electronic equipment, but shares another drawback with the galvanometer. Both the galvanometer and Hall effect meter use heavy windings (electromagnets) within the instrument. When the current flow is too great for the meter's internal windings to carry, an external current transformer is normally used which introduces greater cost, greater instrument error and restricts use to AC applications. Other drawbacks are the large physical size of the wattmeter and the potential danger to the user unless suitable precautions are taken.

The power monitoring device disclosed in U.S. Pat. No. 4,096,436 to Cook et al overcomes many of the problems of the earlier approaches. In the '436 patent there is disclosed a device which uses a current shunt wired in series with the load. In operation, the voltage drop across the shunt is proportional to the current flowing through the load and the monitor multiplies this signal with a signal related to voltage drop across the load to form an output signal related to power. This output signal can be used to drive a display of the instantaneous power being drawn by the load or can be wired to an external device such as a process controller like that disclosed in U.S. Pat. No. 4,279,013 to Cameron et al.

SUMMARY OF THE INVENTION

Pursuant to the present invention, a method and apparatus is disclosed that provides a highly flexible device capable of performing a wide variety of different functions while at the same time providing very accurate measurement of energy-related parameters dissipated by a load. The various advantages of this invention will become apparent to those skilled in the art after a study of the following specification. Among those advantages is the provision of bidirectional communications capabilities that permit an external computer to read and write information into an onboard microcomputer system within the same housing that performs the electronic measurement of the energy consumption being monitored. In one embodiment, an external source is used to load an alarm limit into the onboard memory, with the processor comparing the instantaneous value of power consumed by the load with that alarm limit value. If the limit value is exceeded, an output is generated that can be used to alter machine operation. In such manner, the device can be used to prevent catastrophic damage to the machine in the event of broken tools or the like which cause extreme values of power to be generated.

Provision is also made to use the processor to periodically calibrate the device during the measuring process. Analog circuitry is used as part of the measuring circuity. As known in the art, analog devices inherently have a problem with drift characteristics due to changes in the ambient environment. The present invention makes advantageous use of the onboard processor to control the operation of the analog devices and to periodically undergo calibration steps to compensate for drift that may be introduced into the system.

BRIEF DESCRIPTION OF THE DRAWINGS

These and various other advantages will become apparent to one skilled in the art upon a study of the following specificaton and by reference to the drawings in which:

FIG. 2 diagrammatically illustrates a power monitor of this invention mounted in a motor control panel for a machine tool;

FIG. 5 is a simplified block diagram of some of the major components used during the calibration process.

DESCRIPTION OF THE PREFERRED EMBODIMENT

Figure 1:
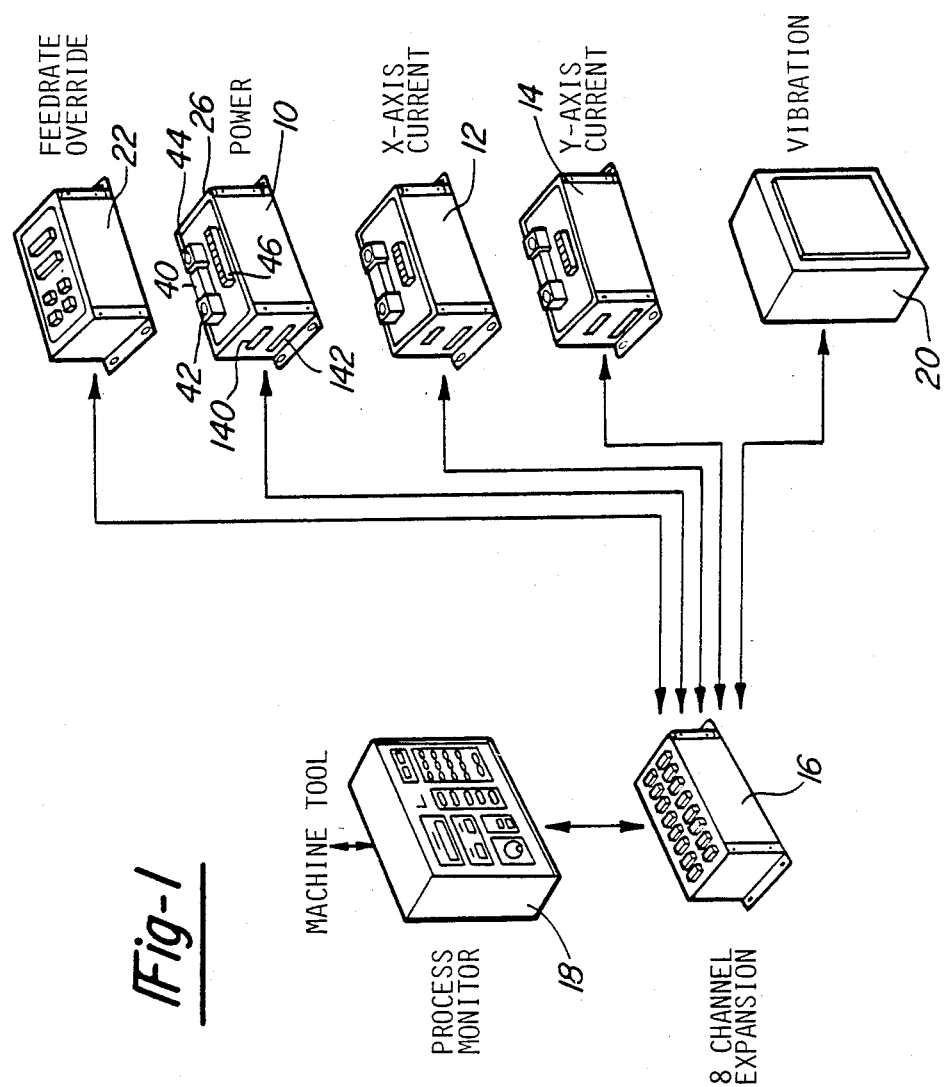
FIG. 1 diagrammatically illustrates an arrangement utilizing one or more devices made in accordance with the present invention to monitor various parameters in a machine tool environment.

Some of the flexibility of the device of the present invention can be appreciated by reference to FIGS. 1 and 2. In FIG. 1, monitoring devices 10, 12 and 14 are made in accordance with the teachings of this invention. These devices are used to measure energy related parameters consumed by motors in a machine tool. For example, device 10 monitors power dissipated in a motor, device 12 measures current drawn by a drive motor for a given linear slide axis of a machine tool, whereas device 14 similarly measures current in a drive motor for another linear slide axis in the machine. The outputs from these devices can be coupled through an expansion device 16 to a more sophisticated process monitor 18. Process monitor 18 is designed, for example, to receive various monitored parameters, including the outputs from devices 10, 12 and 14 as well as other parameters such as vibration provided by the output of device 20, during the operation of a machine tool. Monitor 18 can use this information in a variety of manners such as to provide adaptive control of the machining process via a feed rate override device 22.

In FIG. 2 a power monitoring device 24 of this invention is shown with a housing 26 (shown in more detail in FIG. 1 for devices 10, 12 and 14) which is of sufficiently small size to permit it to be mounted in a motor control panel 28 for a machine tool that is diagrammatically illustrated at 30. Motor control panel 28 conventionally includes the electronics and front panel of a machine controller 32 such as an NC or CNC controller that instructs the operation of the machine tool 30. Machine tool 30 includes at least one motor 34 which can be a DC motor, a single or polyphase AC motor and the like for controlling such things as spindle rotation, linear slide axis motion, etc. For simplicity sake, motor 34 is shown as a single phase AC motor connected to a source 36 via power line 38 having two conductors. Housing 26 includes a precision high amperage resistor or shunt 40 bridging two terminals 42 and 44. Shunt 40 is connected in series with motor 34 such that current flowing through the motor must also flow through the shunt 40. Consequently, a voltage is developed across the shunt 40 which is proportional to the current flow through the motor 34 or other load. The voltage drop across motor 34 is provided by way of a connection labeled V1 coupled to a terminal block 46 (see FIG. 1) on the device housing. As is known in the art, the voltage actually dropped across motor 34 is converted into a current signal with a series resistor that is within the input limits of the internal device analog components, such signal still being proportional to the voltage across the motor or load being monitored.

Figure 3:
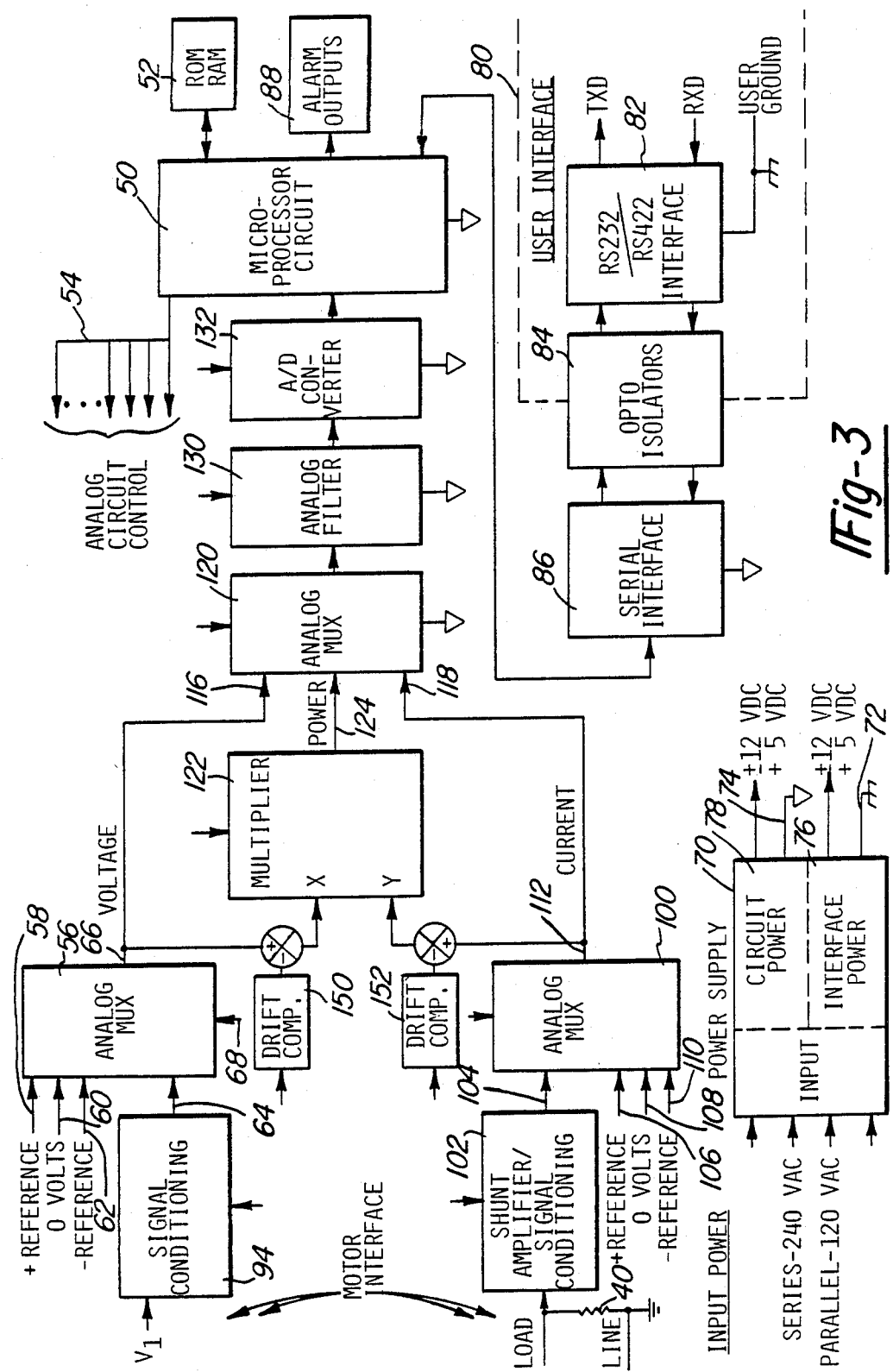
FIG. 3 is a block diagram of the electrical circuitry for the preferred embodiment of the invention.

FIG. 3 illustrates the main functional components of the monitoring device of the present invention. Lying at the heart of the circuit design is an onboard microcomputer including processor 50 and memory 52. Memory 52 is conventionally of the read only memory (ROM) type that contains programmed instructions and of the random access memory (RAM) type that can be written into or read. By way of a nonlimiting example, processor 50 can be a commercially available 8 bit device such as the Motorola 6801 microprocessor family. Processor 50 conventionally includes a plurality of input ports and output ports. Several of the output ports are used to control the operation of analog components in the system circuitry. These output ports are represented by the arrows 54 issuing from processor 50 and by the various arrows pointing in towards the boxes representing the various analog components. For example, one of the analog components is a multiplexer 56 which has a plurality of inputs 58, 60, 62 and 64 and an output 66. As will be discussed later herein in more detail, processor 50 is used to select which one of the inputs will be coupled to the output line 66 by applying an appropriate signal on the select input line 68.

One of the advantageous features of this invention is that the microprocessor can be used to control the analog components without requiring the use of isolation means such as opto-isolators between the processor and the analog components. It will be appreciated that the voltage and current signals to be measured is usually at a much higher level than can be normally tolerated by the circuit components if they were referenced to ground. Ground reference, on the other hand, is required in order to established bidirectional communications with an external computer. In order to resolve this dilemma, a special power supply circuit 70 is provided that provides two sets of regulated DC supply voltages. One set is referenced to earth ground (represented by the symbol line 72) while another set is allowed to float, i.e. is referenced to a system ground represented by the symbol on line 74. In such manner the power supply 70 includes means 76 to supply power to the communications interface and means 78 to supply power to the circuit components.

The monitor device of the present invention is provided with a user interface generally designated by the numeral 80 which includes bidirectional communication circuitry that enables the monitor device to both transmit and receive data using RS 232 or RS 422 protocols. The power to the communications interface circuitry 82 is provided by the power supply means 76 utilizing an earth ground reference which is compatible with the earth ground reference used on external computer systems. A series of optical isolators 82 are used to isolate the communications interface (which is connected to an external source) from the internal device components (which are floating at a much higher potential). The opto-isolators 84 are coupled to the microprocessor 50 through a serial interface 86. In such manner, it is possible for an external computer such as host system or controller for a machine tool to write data into the RAM memory 52 or read information out of the RAM, thus controlling device operation. By way of a nonlimiting example, the external computer can be used to store limit values in the RAM memory 52. The limit values are associated with such things as an extreme value of power that should not be exceeded during operation of the machine tool 30. The processor 50 will compare the instantaneous power drawn by the machine tool and compare it with the stored limit value. If the limit value is exceeded, processor 50 provides a suitable output to an external connector (labeled alarm outputs 88) which can be connected to the machine controller 32. With reference to FIG. 2, the monitor device 24 provides an output over line 90 to controller 32 to alter the machine operation in the event that an alarm condition is detected. The alarm signal can be used for a variety of things such as shutting down the machine tool 30. The line 92 in FIG. 2 is used to establish the bidirectional communication capability between the machine controller 32 and the monitoring device 24 of the present invention.

Returning now to FIG. 3, the electronic measuring process will now be described. The signal V1 associated with the voltage drop across the motor is applied to one input 64 of multiplexer 56 through suitable signal conditioning circuitry 94. Similarly, the voltage signal (I) associated with the current through shunt 40 is connected to analog multiplexer 100 through signal conditioning circuitry 102. Processor 50 applies an appropriate signal to the select inputs of multiplexers 56 and 100 such that the voltage and current-related signals on lines 64 and 104 are applied to the outputs 66 and 112 of the multiplexers 56 and 100. Thus, the outputs on lines 66 and 112 are related to the voltage across the load and the current through the load, respectively. Since it is sometimes desirable to just measure voltage and/or current, the lines 66 and 112 are connected to inputs 116 and 118 of another analog multiplexer 120. The present invention advantageously has the capability of also providing a measurement of power which, as well known, is the product of voltage and current through the load. To this end, a multiplier 122 is provided to which the voltage and current signals are applied to the multiplier inputs X and Y, respectively. Multiplier 122 operates in a known manner to multiply the signals applied to its inputs together and provide an output related to the product thereof, such output in this case being proportional to power consumed by the load as a result of the multiplication of the current and voltage signals together.

Thus, three options are presented to the inputs to analog multiplexer 120: voltage on line 116, current on line 118 and power on line 124. Microprocessor 50 selects the desired input by applying appropriate control signals to the select input of multiplexer 120. The output thereof is suitably filtered by a processor-controller filter network 130 whose output, in turn, is connected to an analog-to-digital converter 132. Thus, the output of A/D converter 132 is a digital representation of voltage, power, or current as the case may be. Assuming that power is to be measured, this measurement can be stored in RAM memory 52 on a periodic basis to thereby provide an historical compilation of the power consumed by the machine motor 30 over a period of time. This data can be read out by an external computer and is useful for such things as planning period maintenance and the like. As noted above, the instantaneous power signal can be compared against stored limit values on memory 52 and an alarm signal generated if the limit value is exceeded. A variety of different alarm conditions can be monitored and, to this end, several different alarm output lines are provided via a suitable connector 140 shown in FIG. 1. The connector 142 for the communications interface is illustrated in FIG. 1.

Figure 4A:
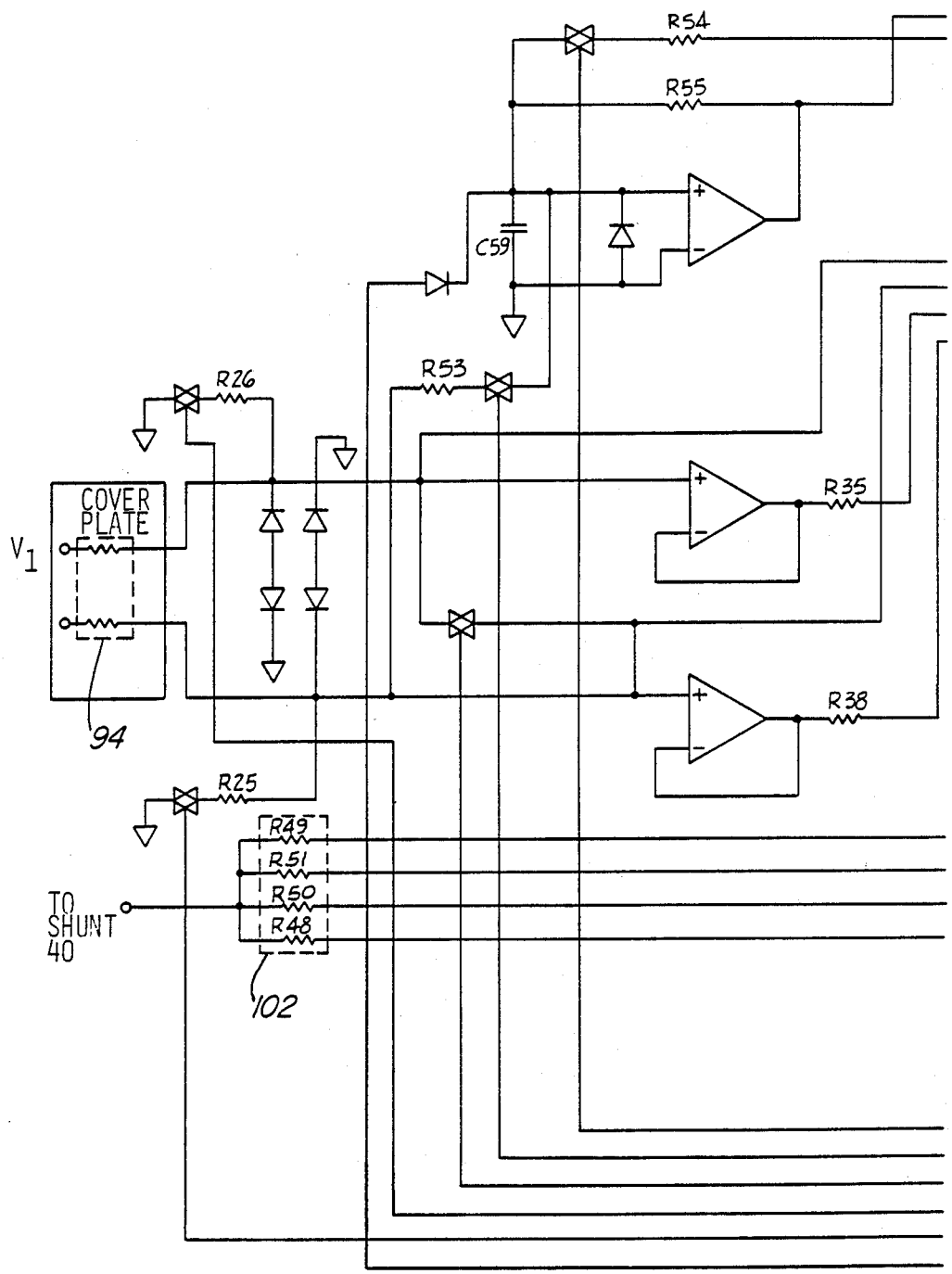
FIG. 4(A–C) is a more detailed schematic diagram of some of the circuitry shown in block diagram form in FIG. 3.
Figure 4B:
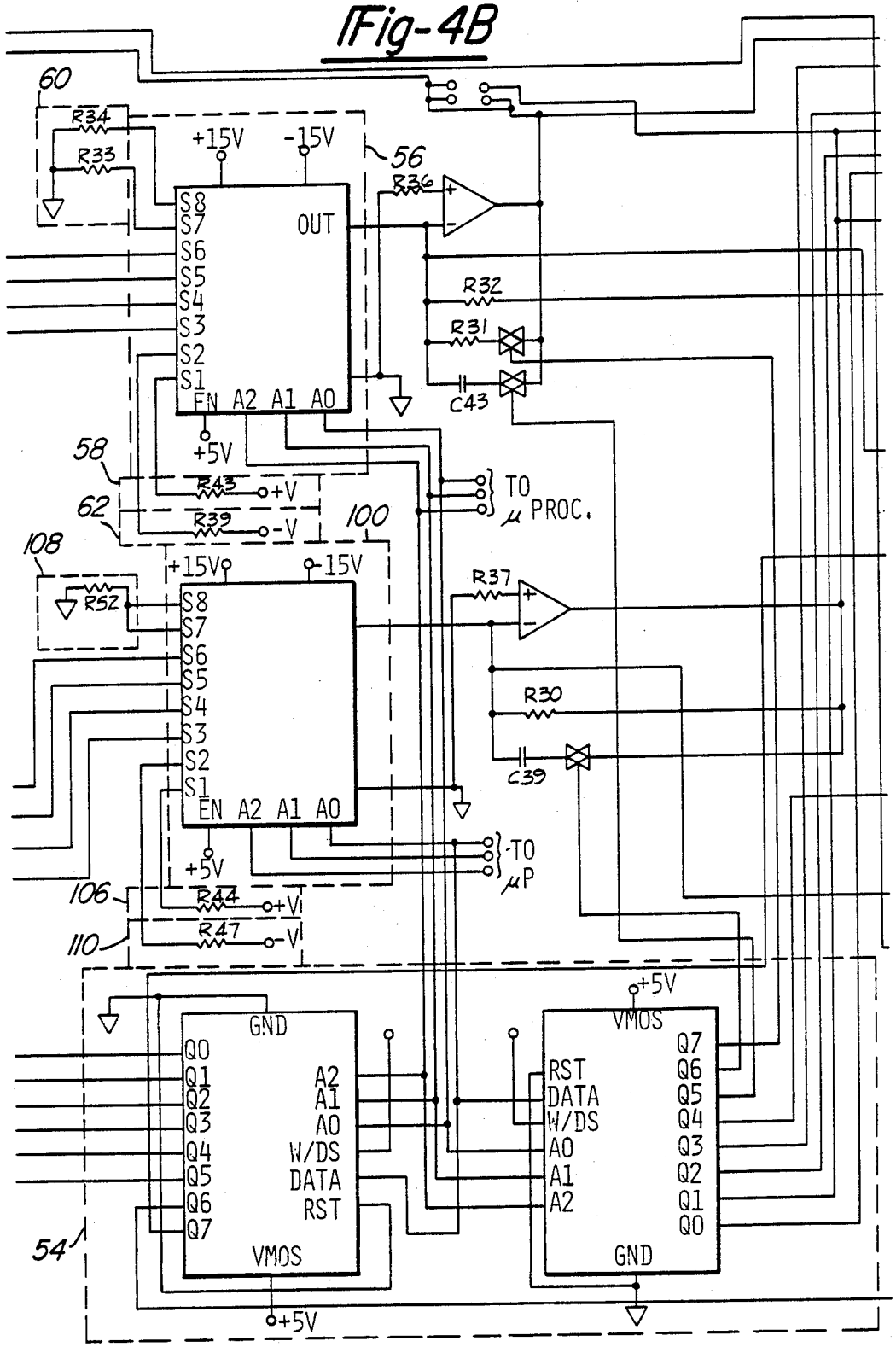
Figure 4C:
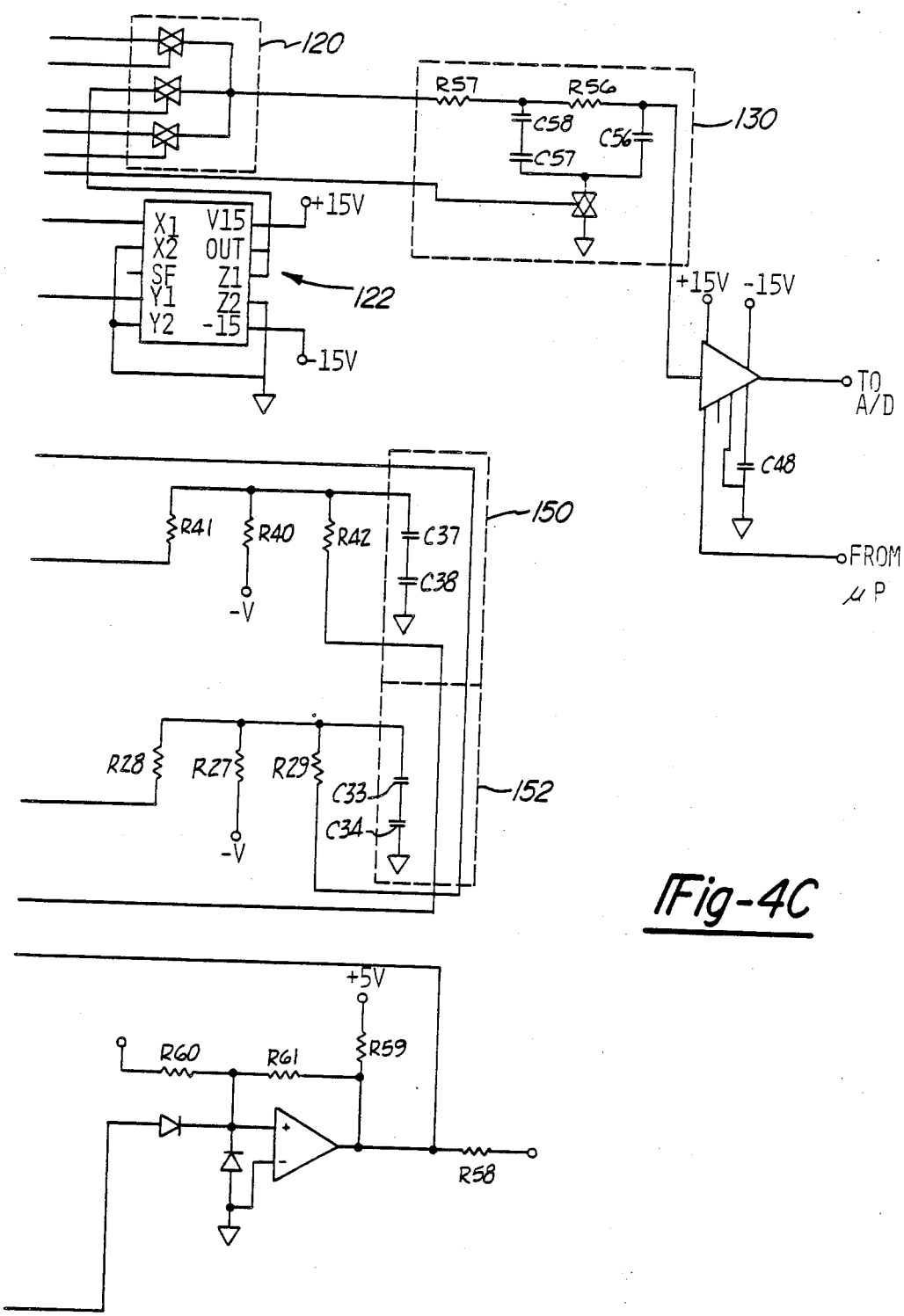

FIG. 4(A–C) is a more detailed schematic diagram that uses conventional symbols to represent the individual components of the circuitry that makes up many of the functional blocks discussed in connection with FIG. 3. Since the symbols are conventional there is no need to provide a component-by-component identification of their respective interconnections. However, the individual components which make up the functional blocks in FIG. 3 are encompassed by dotted lines and bear the same reference numerals as their corresponding functional box in FIG. 3. This should be more than sufficient information for a person of ordinary skill in the art to make and use the present invention.

The accuracy of the foregoing measurement is insured by the dynamic calibration technique provided by way of a feature of this invention. It is well known that analog components inherently are subject to drift, i.e., a change in their output level even though the input thereto does not change. These drift characteristics are typically due to heat and other factors. Thus, it can be seen that this drift could affect the accuracy of the measurement unless otherwise compensated. The compensation technique of the present invention is best explained with reference to FIG. 5 where the circuit diagrams of FIGS. 3 and 4 are simplified in order to highlight those components that are used in the calibration process.

With reference then to FIG. 5, processor 50 manipulates the muiltiplexers 56, 100 and the drift compensator networks 150, 152 so as to periodically perform a calibration step. This calibration step occurs dynamically, i.e., it is an ongoing process that occurs very quickly so that it does not take up too much time away from the normal measuring function of the circuitry. As described above, the multiplexers 56 and 100 have the voltage and current inputs 64 and 106 connected to their outputs 66 and 112, respectively, during the measuring process. During the calibration process, however, the muiliplexers are controlled by processor 50 to couple other inputs to their respective outputs.

In the preferred embodiment, the calibration process is carried out as follows. Processor 50 causes the zero (0) volt reference on line 60 to be coupled to the output 66 of multiplexer 56. Thus, a zero volt signal is applied to the input labeled X of multiplier 122. Processor 50 also selects the positive voltage (+) reference on line 106 to be coupled to the output line 112 of multiplexer 100. This presents a fixed positive reference to the other input Y of the multiplier 122. Normally, there will be some nonzero output of the multiplier 122 and this is converted by A/D convertor 132 and temporarily stored in the RAM memory 52. Then, the negative (−) reference on line 110 is coupled through multiplexer 100 to the input (Y) of multiplexer 122. The output of multiplexer 122 under these conditions is converted by A/D convertor 132. Processor 50 subtracts this new value from the old value stored in RAM memory 52 (or other suitable register). If there is a positive change (i.e., the new value is larger than the old value) this means that there is a negative offset applied to the X input of the multiplier. In other words, the polarity of the signal applied to the X multiplier input must be negative since the result of multiplying it with another negative signal on the Y input was positive (greater than the previously stored value). The optimum, of course, is to have no change of the multiplier output when the reference levels to the multiplier 122 change. This is because the X multiplier input is being held to zero and the product should be the same (theoretically zero) regardless of the signal on the Y multiplier input.

In order to compensate for the detected positive change, the microprocessor 50 generates suitable signals on line 170 to generate a more positive output from drift compensator network 150. Conversely, if there is a negative change (i.e., the next reading is smaller than the previous reading) the processor alters the duty cycle so that the network 150 will provide a more negative compensating output voltage. The output from network 150 is summed at summing node 151 to provide a compensated signal to the input X of multiplier 122. Similarly, summing node 153 combines the output of network 152 with the signal on line 112 to provide compensation for the Y multiplier input. In the preferred embodiment, the network 150 includes one or more capacitors diagrammatically illustrated by the component bearing reference numeral 172. Capacitor 172 normally has a fixed negative voltage applied thereto. Thus, the normal output from network 150 is a negative output. In order to make this output a positive one, the microprocessor 170 uses a duty-cycle control technique (sometimes referred to as pulse width modulation technique) in order to apply a more positive charge to the capacitor 172. As is known in the art, the output voltage from an output port of a digital microprocessor usually varies from about a zero volt (defining a logical zero level) to +5 volt (defining a logical one level) depending on the design of the processor. If the output line 170 from the microprocessor is held at a logical high level (e.g., +5 volts) for a sufficient period of time then the ultimate charge stored in capacitor 172 will change from a negative to positive voltage. The ultimate voltage level will depend upon the length of time (i.e., duty cycle or pulse width) of the logical high (+V) signal from the microprocessor. Conversely, the ultimate charge from network 150 can be left at the −V reference level by keeping line 170 at a logical zero (0 volt level).

This process continues iteratively until there is no change between the previous and current A/D converter readings.

After the compensating voltage for network 150 is set, a similar process is used to define the compensating voltage for network 152 associated with the other multiplier input. Briefly, the output on line 112 is set to zero and the output on line 66 set to the plus reference level. A reading is taken and then stored. Then the line 66 from multiplexer 56 is set to the negative reference level and the reading subtracted from the previous reading, with the microprocessor 50 using the same approach described above to vary the output of the compensation network 152 which also incorporates one or more capacitors 174. This process continues periodically throughout the entire operational cycle of the monitoring device. Preferably, the calibration process occurs in such manner that it is transparent to the measuring process of the monitoring device, i.e., the software is written so that the measuring and calibration processes are intermixed.

Other general calibration functions are also performed in the preferred embodiment of this invention. For example with the multiplier input offsets properly trimmed as described above, all the other offsets are linear and therefore add algebraically. Hence, they can be compensated for at the same time. This can be accomplished by selecting the zero volt level to be applied to both inputs of multiplier 122, reading the outputs of the A/D converter 132 and then using the microprocessor to subtract this reading from subsequent readings. Other offset values which have been previously calculated are also used to arrive at the ultimate power output calculation thereby ensuring accuracy of the device. For example, an absolute zero command is used when there is no power applied to the motor 34 to establish a base "zero" level for the system circuitry. This "zero" value is permanently stored in RAM 52 and added back into subsequent A/D converter readings to arrive at the ultimate measurement calculation.

When the system is newly calibrated, the last step is generally to apply the positive voltage to both inputs of the multiplier and to, thereafter, apply a positive reference to one input and a negative reference to the other. The difference in the readings from the A/D converter 132 is permanently stored as a measure of the linear gain of the internal circuitry used in the device at that point in time. Subsequently, during operation, the same reference combination is applied to the multiplier and the difference in the A/D readings is compared to the permanently stored difference. The difference in these readings represents the change in gain that the system circuitry has incurred. The processor 50 is then utilized to multiply all subsequent readings by the ratio of these differences.

In view of the foregoing, those skilled in the art can appreciate that the present invention provides a monitoring device that not only is capable of providing very accurate readings but also is extremely flexible and provides the user with a wide variety of functional capabilities such as microprocessor signal conditioning and digital filtering, while at the same time performing calibration with no moving parts such as potentiometers and the like. It should be understood that while this invention was described in connection with a particular example thereof, various modifications will become apparent to the skilled practitioner upon a study of the specification, drawings and following claims.

What is claim is:

1. Apparatus for measuring energy used by an electrical load, said apparatus comprising:
    analog circuit means for providing electrical analog signals related to the energy used by the load, said analog circuit means including:
    a first multiplexer having a plurality of inputs and an output, a first input being coupled to the load, a second input being coupled to a source of positive reference voltage, a third input being connection to a source of negative reference voltage, and a fourth input being connected to a substantially zero voltage source;
    second multiplexer means having a plurality of inputs and an output, a first input being connected to the laod, a second input being connected to a source of positive reference voltage, a third input being connected to a source of negative reference voltage, and a fourth input being connected to a substantially zero reference voltage source; and
    a multiplier having first and second inputs and an output, the first input of the multiplier being connected to the output of the first multiplexer, with the second input of the multiplier being connected to the output of the second multiplexer;
    analog to digital converter means coupled to the output of the multiplier for converting said analog signal to a digital representation thereof;
    digital processor means coupled for receipt of the digital representation from the converter means, said processor serving to select which inputs of the multiplexers are coupled to the outputs thereof, said processor in one mode of operation causing the first inputs of the first and second multiplexers to be coupled to the outputs thereof whereby the digital representation from the converter means is related to energy consumed by the load, with said processor means periodically selecting the second, third and fourth inputs of the first and second multiplexers in a predetermined sequence in a calibration mode of operation; and
    bidirectional communication means coupled to the digital processor means for providing two way communication between the processor and an external computer.

2. The apparatus of claim 1 wherein the apparatus is adapted to measure power, and wherein:
    said first input of the second multiplexer receives a signal related to current through the load;
    said first input of the first multiplexer being coupled for receipt of a signal related to voltage drop across the load;
    and wherein the apparatus further includes:
    a third multiplexer having inputs connected to the outputs of the first multiplexer, the second multiplexer, and the multiplier whereby the apparatus can selectively measure voltage, current and power used by the load.

3. The apparatus of claim 1 wherein the bidirectional communication means includes interface means coupled to the external computer for receiving and transmitting information therefrom; and wherein said apparatus further comprises:

isolation means for electrically isolating the interface from the processor and other electrical components in the apparatus; and power supply means providing a first set of regulated supply voltages that reference earth ground for use by the interface means to make it compatible with the external computer, and a second set of regulated supply voltages that reference system ground for the other components whereby the processor electrically floats with the other components to permit direct control of the analog components by the processor.

4. In a power monitor for calculating instantaneous power drawn by an electrical load wherein signals are developed associated with current through the load and voltage drop across the load, wherein the improvement comprises:

a first analog multiplexer having a plurality of inputs and an output, one input being connected to the voltage signal and other inputs being connected to a fixed positive reference, a fixed negative reference and a zero reference level used for calibration purposes;

a second analog multiplexer having a plurality of inputs and an output, one input being connected to said current signal and other inputs being connected to a fixed positive reference, a fixed negative reference, and a zero reference level used for calibration purposes;

multiplexer means having a first input connected to an output of the first multiplexer and a second input coupled to the output of the second multiplexer;

calculation means including said multiplier for converting the voltage and current signals into a digital representation of instantaneous power drawn by the load; and digital processor means and associated memory, said processor being coupled to said multiplexers and selecting which inputs are coupled to outputs thereof thereby determining whether the outputs are used for calculation of the instantaneous power or calibration of the analog components.

5. The apparatus of claim 4 which further comprises:
first drift compensator circuitry connected between the first input of the multiplier and the processor;
second drift compensator circuitry connected between the second input to the multiplier and the processor; and
said first and second drift compensator circuits including capacitor means therein charged to various levels by signals from the processor to generate offset voltages to be applied to their respective inputs of the multiplier.

6. The apparatus of claim 5 wherein said capacitor means are normally charged with a voltage of a given polarity, with said processor being adapted to change the voltage on the capacitor by applying a voltage of opposite polarity to the capacitor, with the degree of change being a function of the time at which the voltage of opposite polarity is applied to the capacitor.

7. In a method of measuring the product of two parameters using electrical circuitry in which the parameters are multiplied together in an analog multiplier, the improvement wherein the circuitry is calibrated according to the method comprising:

(a) applying a substantially zero voltage level signal to one input of the analog multiplier;

(b) applying a fixed positive voltage to a second input of the multiplier;

(c) storing a first output signal of the multiplier which is a function of the product of the two signals applied to the multiplier inputs;

(d) then, applying a negative reference voltage to the second input of the multiplier to generate a second output signal thereof;

(e) comparing the difference between the first and second output signals of the multiplier;

(f) applying an offset voltage to an input of the multiplier as a function of the comparison; and (g) thereafter, using the multiplier to generate the product of the two parameters.

8. The method of claim 7 wherein said parameters are voltage and current used by an electrical motor and wherein said multiplier is used to generate a signal representative of instantaneous power drawn by the motor.

9. The method of claim 7 which further comprises the steps of:

applying a substantially zero voltage level signal to said second input of the multiplier;

applying a fixed positive voltage level to said first input of the multiplier;

storing a third output signal of the multiplier;

then, applying a negative reference voltage to the first input of the multiplier to generate a fourth output signal thereof;

comparing the difference between the third and fourth output signals of the multiplier; and applying an offset voltage to the second input of the multiplier as a function of the comparison.

10. The method of claim 7 wherein steps (b) and (d) are performed by using a digital processor to select one of a plurality of inputs of an analog multiplexer.

11. The method of claim 10 wherein said processor is used to define the offset voltage level by varying the charge on a capacitor coupled to an input of the multiplier.

12. The method of claim 11 wherein the capacitor is coupled to a fixed reference level of a given polarity and wherein the processor changes the polarity of the stored charge by applying voltage of an opposite polarity for a selected period of time which is a function of the comparison of step (e).

13. In an apparatus for measuring the product of two parameters using an analog multiplier, the improvement comprising:

a first multiplexer having a plurality of inputs and an output, with a first input being connected to an input for receiving said parameter, second input for receiving a substantially fixed positive reference level, a third input receiving a substantially fixed negative reference level, and a fourth input receiving a substantially zero reference level;

second multiplexer means having a plurality of inputs and an output, a first input thereof being connected to receive the other parameter, a second input receiving a substantially fixed positive reference level, a third input receiving a substantially fixed negative reference level, and a fourth input receiving a substantially zero reference level;

multiplier means having first and second inputs respectively connected to the outputs of the first and second multiplexers;

selector means for selecting which inputs of the multiplexers are connected to the outputs therof, said selector means being operable in a calibration mode of operation to select said second, third and fourth multiplexer inputs in a predetermined sequence;

compensation means connected to the inputs of the multiplier for providing compensating voltages thereto as a function of the outputs of the multiplier during the calibration mode; and said selector means periodically connecting the first inputs of the first and second multiplexers to their outputs whereby the multiplier is used to generate a signal relating to the product thereof.

14. The apparatus of claim 13 wherein said compensating means generates offset voltage levels by varying the charge on a capacitor coupled to the inputs of the multiplier.

15. The apparatus of claim 14 wherein a processor changes the amount of stored charge on the capacitor by applying a voltage of a given polarity for a selected period of time as a function of the multiplier output during the calibration mode.

16. A method of monitoring a machine tool having a motor, the method comprising:

mounting a housing of a device in a motor controlled panel of a machine tool, said housing containing a pair of external terminals bridging a current shunt, at least one voltage input terminal, at least one alarm output connector and a bidirectional communications interface connector, and said housing further including a programmable computer having a processor and a memory;

programming the memory from an external source through the communications interface connector so that the memory contains at least one limit value;

connecting the housing to a power line for the motor such that the current shunt is in series with the motor and so that the voltage input terminal provides an indication of voltage drop across the motor;

multiplying in an analog multiplier circuit a signal applied to the device housing associated with voltage and a signal associated with current thereby providing an analog output related to instantaneous power consumed by the motor;

periodically converting the output of the multiplier into digital representations of instantaneous power;

storing the digital representations of instantaneous power over a period of time in said memory;

transmitting the stored power information to said external source in response to a given command therefrom whereby to provide historical information about power usage by the machine;

comparing the digital representations of power with the programmed limit in the memory; and transmitting an output through the alarm output connector for altering machine operation if the detected instantaneous motor power exceeds the limit value.

17. The method of claim 16 wherein said calibration includes the steps of:

dynamically compensating for drift by using the processor to vary an offset voltage to at least one input of the multiplier circuit.

18. The method of claim 17 wherein said offset voltage is generated by using a duty cycle control technique to alter the charge on a capacitor connected to an input of the multiplier circuit.

19. A method of monitoring a machine tool having a motor, the method comprising:

mounting a housing of a device in a motor control panel of a machine tool, said housing containing a pair of external terminals bridging a current shunt, at least one voltage input terminal, at least one alarm output connector and a bidirectional communications interface connector, and said housing further including a programmable computer having a processor and a memory;

programming the memory from an external source through the communications interface connector so that the memory contains at least one limit value;

connecting the housing to a power line for the motor such that the current shunt is in series with the motor and so that the voltage input terminal provides an indication of voltage drop across the motor;

multiplying in an analog multiplier circuit a signal applied to the device housing associated with voltage and a signal associated with current thereby providing an analog output related to instantaneous power consumed by the motor;

converting the output of the multiplier to a digital representation of power;

comparing the digital representation of power with the programmed limit value in the memory;

transmitting an output through the alarm output connector for altering machine operation if the detected instantaneous motor power exceeds the limit value; and periodically using said processor to calibrate analog components including the multiplier circuit contained within the housing.

20. The method of claim 19 wherein said calibration includes the steps of:

dynamically compensating for drift by using the processor to vary an offset voltage to inputs of the multiplier circuit.

21. The method of claim 20 wherein said offset voltage is generated by using a duty cycle control technique to alter the charge on a capacitor connected to an input of the multiplier circuit.

22. Apparatus for monitoring energy consumed by a motor in a machine tool, said apparatus comprising:

a current shunt having two terminals adapted to be connected in series with a power line to the motor;

a voltage input terminal adapted to be connected to the power line to provide an indication of instantaneous voltage drop across the motor;

multiplier means connected for receipt of input signals related to motor current and voltage, adapted to provide an analog output signal related to instantaneous power consumed by the motor;

analog to digital converter means for converting the analog power signal to a digital representation thereof;

a digital processor and associated random access memory;

said memory containing at least one limit value relating to power;

said processor being adapted to compare said stored limit value with the digital representation of instantaneous power consumed by the motor;

bidirectional communication means connected to the processor and said memory, adapted to provide bidirectional communication between said processor and an external computer whereby information can be written into and read out of said memory;

a housing of sufficiently small size to be mounted within a motor control panel of the machine tool; and wherein said bidirectional communication means includes isolation means adapted to isolate circuitry within the housing including the processor from the external computer whereby the processor can be used to control operation of analog components within the apparatus without the need for further isolation.

* * * * *

UNITED STATES PATENT AND TRADEMARK OFFICE
CERTIFICATE OF CORRECTION

PATENT NO. : 4,839,819

DATED : June 13, 1989

INVENTOR(S) : John D. Begin, James E. Berry and Paul D. Kretzmer

It is certified that error appears in the above-identified patent and that said Letters Patent is hereby corrected as shown below:

<u>Title page,</u>
<u>Item [73]</u>
<u>Assignee</u>: "CTE" should be —GTE—.

Col. 2, line 34, "specificaton" should be —specification—.

Col. 3, line 68, "established" should be —establish—.

Col. 6, line 19, "multiplexer" should be —multiplier—.

Col. 6, lines 19-20, "multiplexer" should be —multiplier—.

Col. 8, line 14, "connection" should be —connected—.

Col. 8, line 20, "laod" should be —load—.

Col. 10, line 67, "therof" should be —thereof—.

Signed and Sealed this

Twelfth Day of June, 1990

Attest:

HARRY F. MANBECK, JR.

*Attesting Officer*　　　　　*Commissioner of Patents and Trademarks*